(12) United States Patent
Kunieda

(10) Patent No.: US 12,150,244 B2
(45) Date of Patent: Nov. 19, 2024

(54) WIRING SUBSTRATE HAVING OPTICAL WAVEGUIDE

(71) Applicant: IBIDEN CO., LTD., Gifu (JP)

(72) Inventor: Masatoshi Kunieda, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 263 days.

(21) Appl. No.: 17/809,352

(22) Filed: Jun. 28, 2022

(65) Prior Publication Data

US 2023/0007768 A1 Jan. 5, 2023

(30) Foreign Application Priority Data

Jul. 5, 2021 (JP) .................. 2021-111576

(51) Int. Cl.
  *H05K 1/02* (2006.01)
  *H05K 1/11* (2006.01)
  *H05K 1/18* (2006.01)

(52) U.S. Cl.
  CPC ........... *H05K 1/0274* (2013.01); *H05K 1/111* (2013.01); *H05K 1/181* (2013.01)

(58) Field of Classification Search
  CPC ....... H05K 1/0274; H05K 1/111; H05K 1/181
  See application file for complete search history.

(56) References Cited

U.S. PATENT DOCUMENTS

| | | | | |
|---|---|---|---|---|
| 9,201,203 B2* | 12/2015 | Yamamoto | ........... | G02B 6/4214 |
| 9,402,322 B1* | 7/2016 | Findley | ................ | H05K 1/0306 |
| 2009/0190878 A1* | 7/2009 | Yanagisawa | .............. | G02B 6/43 |
| | | | | 156/60 |
| 2010/0323297 A1* | 12/2010 | Yanagisawa | ........... | H05K 1/113 |
| | | | | 430/315 |
| 2011/0274388 A1* | 11/2011 | Yamamoto | ................ | G02B 6/43 |
| | | | | 29/846 |
| 2013/0272648 A1* | 10/2013 | Terada | ...................... | G02B 6/43 |
| | | | | 385/14 |
| 2016/0313517 A1* | 10/2016 | Yamamoto | ............. | G02B 6/138 |
| 2017/0115453 A1* | 4/2017 | Shishido | ................ | G02B 6/428 |
| 2018/0045903 A1* | 2/2018 | Nakagawa | ........... | G02B 6/4243 |

FOREIGN PATENT DOCUMENTS

JP 2008-129385 A 6/2008

* cited by examiner

*Primary Examiner* — Timothy J Thompson
*Assistant Examiner* — Michael F McAllister
(74) *Attorney, Agent, or Firm* — Oblon, McClelland, Maier & Neustadt, L.L.P.

(57) ABSTRACT

A wiring substrate includes an insulating layer, a conductor layer formed on a surface of the insulating layer and including a conductor pad, a covering layer formed on the insulating layer and covering a portion of the insulating layer, an optical waveguide positioned on the surface of the insulating layer and including a core part, and a conductor post including plating metal and formed on the conductor pad such that the conductor post is penetrating through the covering layer and connected to a component. The insulating layer has a component region covered by the component when the component is connected to the conductor post, the core part has an end surface facing the opposite direction with respect to the insulating layer and exposed in the component region and a distance between the end surface and the surface of the insulating layer is greater than a thickness of the covering layer.

20 Claims, 10 Drawing Sheets

WIRING SUBSTRATE HAVING OPTICAL WAVEGUIDE

CROSS-REFERENCE TO RELATED APPLICATIONS

The present application is based upon and claims the benefit of priority to Japanese Patent Application No. 2021-111576, filed Jul. 5, 2021, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2008-129385 describes an optical component mounting substrate on a surface of which an optical waveguide and an optical semiconductor element are mounted. The entire contents of this publication are incorporated herein by reference.

SUMMARY OF THE INVENTION

According to one aspect of the present invention, a wiring substrate includes an insulating layer, a conductor layer formed on a surface of the insulating layer and including a conductor pad, a covering layer formed on the insulating layer such that the covering layer is covering a portion of the insulating layer, an optical waveguide positioned on the surface of the insulating layer and including a core part that transmits light, and a conductor post including plating metal and formed on the conductor pad of the conductor layer such that the conductor post is penetrating through the covering layer and is connected to a component. The insulating layer has a component region covered by the component when the component is connected to the conductor post, the optical waveguide is formed such that the core part has an end surface facing the opposite direction with respect to the insulating layer and exposed in the component region and that a distance between the end surface and the surface of the insulating layer is greater than a thickness of the covering layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
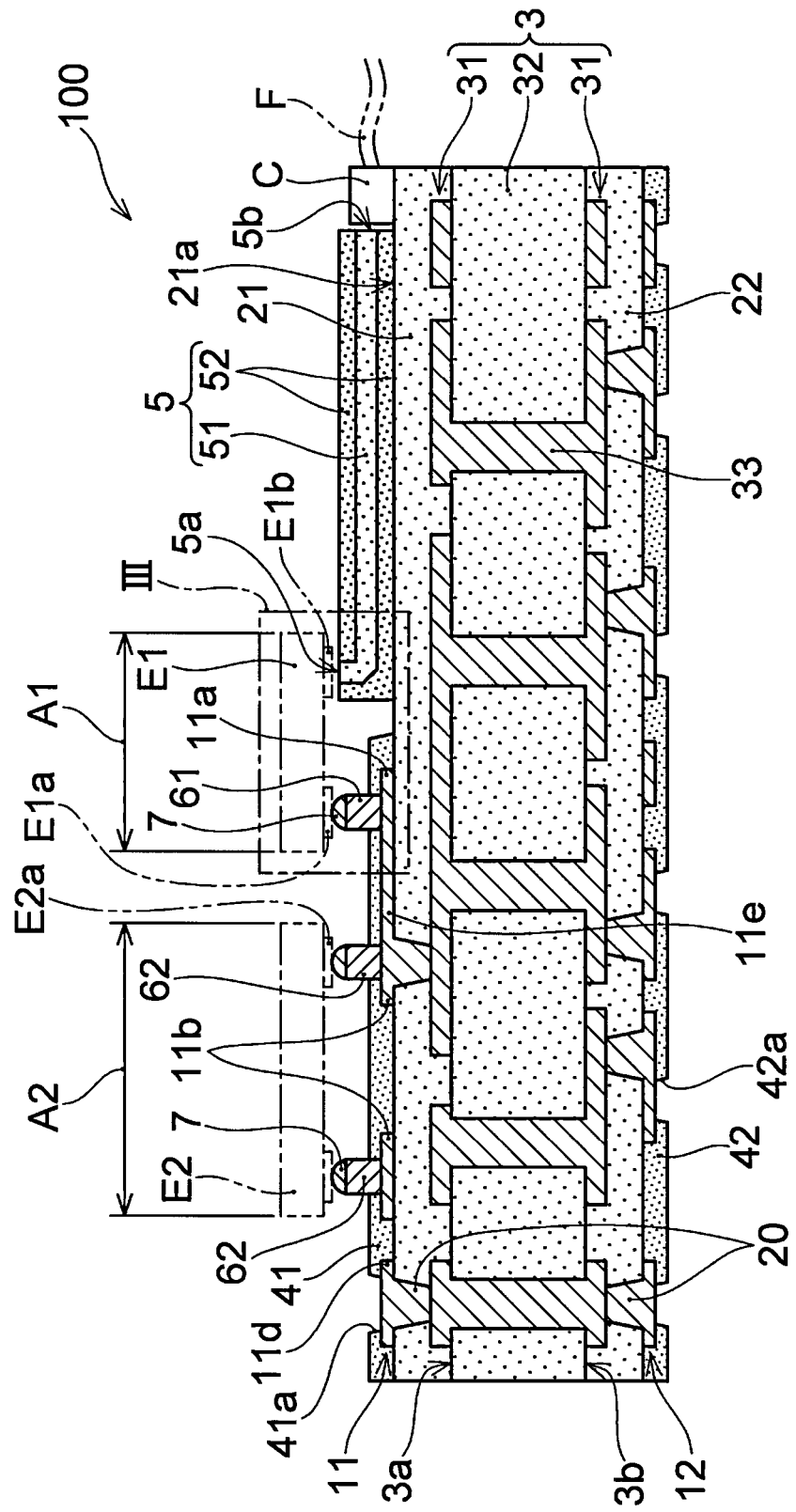
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Figure 2:
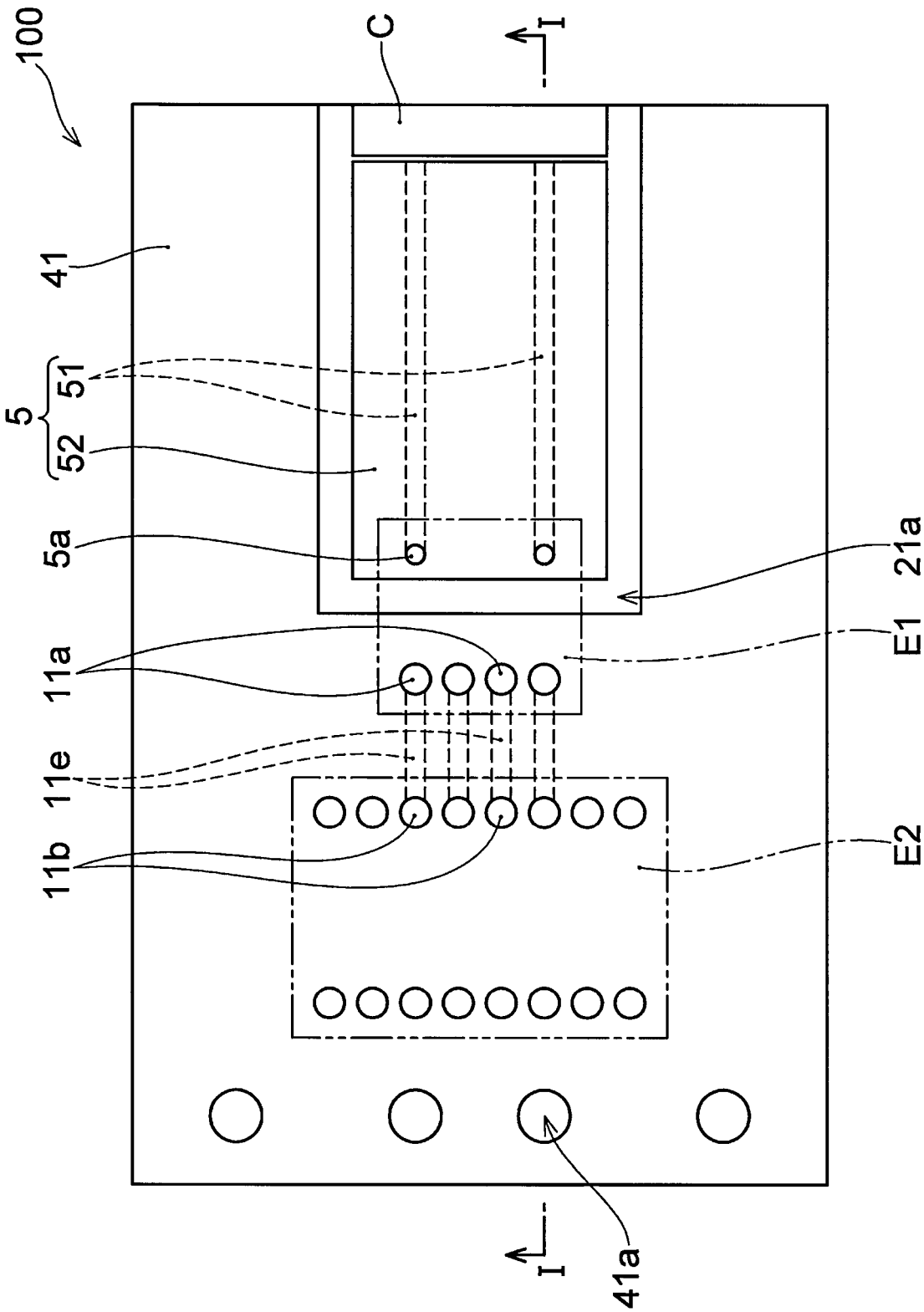
FIG. 2 is a plan view illustrating an example of a surface state of the wiring substrate of FIG. 1.
Figure 3:
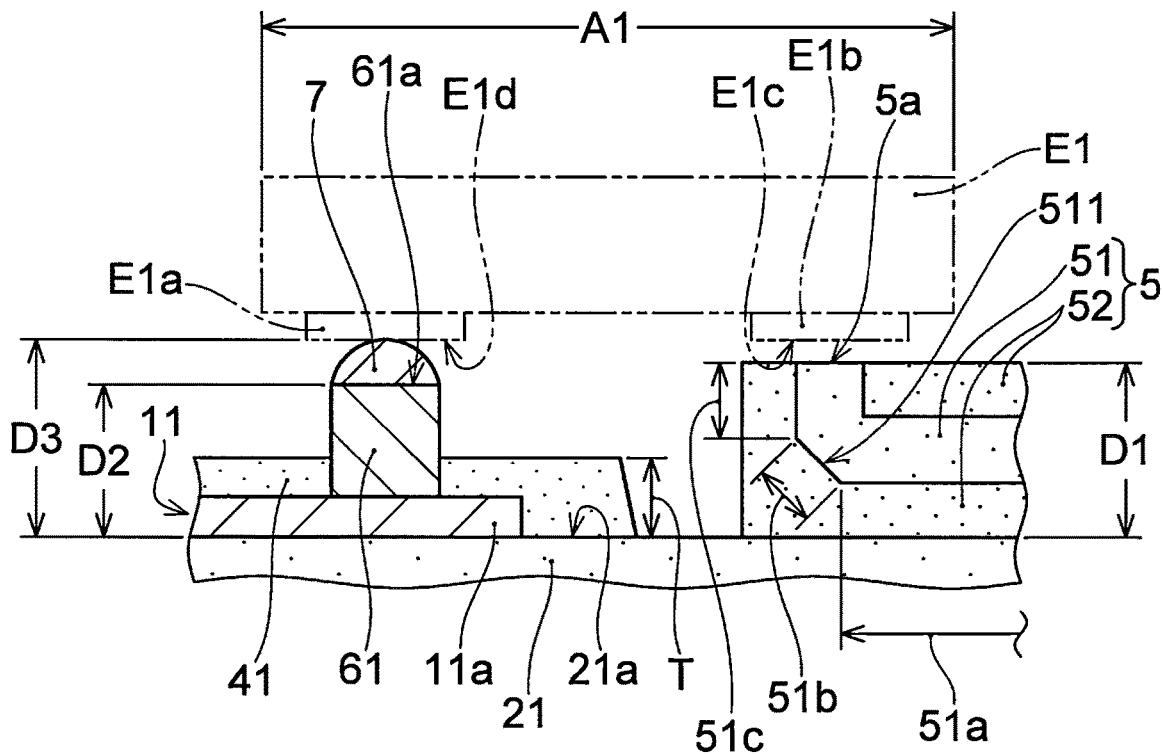
FIG. 3 is an enlarged view of a portion (III) of FIG. 1.

A wiring substrate according to an embodiment of the present invention is described with reference to the drawings. FIG. 1 is a cross-sectional view illustrating a wiring substrate 100, which is an example of the wiring substrate of the embodiment, and FIG. 2 illustrates an example of the wiring substrate 100 of FIG. 1 in a plan view (FIG. 1 is a cross-sectional view along a line (I-I) in FIG. 2). The term "plan view" means viewing the wiring substrate of the embodiment along a thickness direction thereof. FIG. 3 illustrates an enlarged view of a portion (III) of FIG. 1. The wiring substrate 100 is merely an example of the wiring substrate of the present embodiment. A laminated structure, and the number of conductor layers and the number of insulating layers of the wiring substrate of the embodiment are not limited to the laminated structure of the wiring substrate 100 of FIG. 1, and the number of conductor layers and the number of insulating layers included in the wiring substrate 100.

As illustrated in FIG. 1, the wiring substrate 100 includes a core substrate 3, and an insulating layer and a conductor layer sequentially laminated on each of two main surfaces (a first surface (3*a*) and a second surface (3*b*)) of the core substrate 3 opposing each other in a thickness direction of the core substrate 3. The core substrate 3 includes an insulating layer 32 and conductor layers 31 that are respectively formed on a surface of the insulating layer 32 on the first surface (3*a*) side and a surface of the insulating layer 32 on the second surface (3*b*) side. The insulating layer 32 is provided with through-hole conductors 33 that penetrate the insulating layer 32 and connects the conductor layers 31 on both sides of the insulating layer 32 to each other.

In the description of the embodiment, a side farther from the insulating layer 32 in the thickness direction of the wiring substrate 100 is also referred to as an "outer side," "upper side," or simply "upper," and a side closer to the insulating layer 32 is also referred to as an "inner side," a "lower side," or simply "lower." Further, for the conductor layers and the insulating layers, a surface facing the opposite side with respect to the insulating layer 32 is also referred to as an "upper surface," and a surface facing the insulating layer 32 side is also referred to as a "lower surface."

The wiring substrate 100 includes an insulating layer 21 and a conductor layer 11. The insulating layer 21 is laminated on the first surface (3*a*) of the core substrate 3. The insulating layer 21 has a surface (21*a*) on the opposite side with respect to the core substrate 3, and the conductor layer 11 is formed on the surface (21*a*). The wiring substrate 100 further includes a covering layer 41. The covering layer 41 partially covers each of the insulating layer 21 and the conductor layer 11. The covering layer 41 is formed with openings (41*a*) each of which exposes a part of the conductor layer 11.

On the other hand, an insulating layer 22 is laminated on the second surface (3*b*) of the core substrate 3. A conductor layer 12 is formed on the insulating layer 22, and a solder resist 42 covering the insulating layer 22 and the conductor layer 12 is formed. The solder resist 42 is formed of, for example, a photosensitive epoxy resin or polyimide resin, or the like. The solder resist 42 is formed with openings (42*a*) each of which exposes a part of the conductor layer 12. In each of the insulating layer 21 and the insulating layer 22, via conductors 20 connecting the conductor layers that sandwich the insulating layer 21 or the insulating layer 22 to each other are formed.

The wiring substrate 100 further includes an optical waveguide 5 provided on the surface (21*a*) of the insulating layer 21. As illustrated in FIGS. 1-3, the optical waveguide 5 is provided in a region of the surface (21*a*) of the insulating layer 21 that is not covered by the covering layer 41. The optical waveguide 5 includes a core part 51 that transmits light and a clad part 52 that is provided around the core part 51. The clad part 52 sandwiches the core part 51 in any direction orthogonal to an extension direction of the core part 51, that is, a propagation direction of light, and surrounds the core part 51 in a plane orthogonal to the propagation direction. The optical waveguide 5 is fixed to the surface (21*a*) of the insulating layer 21 using, for example, an adhesive (not illustrated in the drawings) or the like. The optical waveguide 5 may be fixed to the surface (21*a*) of the insulating layer 21 by any modes, not limited to an adhesive.

The wiring substrate 100 further includes conductor posts (61, 62) formed on the conductor layer 11. Each of the conductor posts (61, 62) is a conductor having a columnar, frustum-like, or inverted frustum-like shape extending from the conductor layer 11 in the opposite direction with respect to the insulating layer 21. Each of the conductor posts (61, 62) may have any shape in a cross section and a surface orthogonal to the thickness direction of wiring substrate 100. An external component (E1) is connected to the conductor posts 61, and an external component (E2) is connected to the conductor posts 62. That is, the component (E1) and the component (E2) are connected to the wiring substrate 100 when the wiring substrate 100 is used. Therefore, the wiring substrate 100 includes a component region (A1) (first component region), which is a region to be covered by the component (E1) when the wiring substrate 100 is used, and a component region (A2) (second component region), which is a region to be covered by the component (E2) when the wiring substrate 100 is used. The component (E1) connected to the conductor posts 61 is positioned in the component region (A1), and the component (E2) connected to the conductor posts 62 is positioned in the component region (A2). The component (E1) is mounted on the opposite side of the conductor posts 61 and the optical waveguide 5 with respect to the insulating layer 21 side.

Each of the insulating layers (21, 22) and the insulating layers 32 is formed of, for example, an insulating resin such as an epoxy resin, a bismaleimide triazine resin (BT resin) or a phenol resin. Further, although not illustrated, Each of the insulating layers may contain a core material (reinforcing material) formed of a glass fiber, an aramid fiber, or the like, and may contain an inorganic filler formed of fine particles of silica (SiO2), alumina, mullite, or the like.

The covering layer 41 is formed of any insulating material. For example, the covering layer 41 may be formed of the same epoxy resin or polyimide resin as the solder resist 42 and may function as a solder resist preventing a short circuit between the conductor posts. Or, the covering layer 41 may be formed of an epoxy resin, a BT resin, or a phenol resin used for interlayer insulating layers such as the insulating layer 21 and the insulating layer 22. That is, the material of the covering layer 41 is not limited to a specific material as long as the covering layer 41 is insulating and covers predetermined regions of the conductor layer 11 and the insulating layer 21.

The core part 51 and the clad part 52 of the optical waveguide 5 may be formed of an organic material, an inorganic material, or a mixed material such as an inorganic polymer containing an organic component and an inorganic component, the material having an appropriate refractive index. Examples of inorganic materials include quartz glass, silicon, and the like, and examples of organic materials include acrylic resins such as polymethylmethacrylate (PMMA), polyimide resins, polyamide resins, polyether resins, epoxy resins, and the like. Further, inorganic polymers such as polysilane may be used. The core part 51 and clad part 52 may be formed of materials different from each other, or may be formed of materials of the same type. However, for the core part 51, a material having a higher refractive index than that used for the clad part 52 is used. Since total reflection of light incident on an interface between the core part 51 and the clad part 52 at an incident angle equal to or larger than a critical angle is possible, light incident on the core part 51 can efficiently propagate in the core part 51. It is also possible that, after the core part 51 and the clad part 52 are formed using materials having the same refractive index, the refractive indices of the core part 51 and the clad part 52 are made different from each other by appropriate processing. For example, the refractive index of polysilane decreases when irradiated with ultraviolet rays.

The conductor layers (11, 12) and the conductor layers 31, the through-hole conductors 33, the via conductors 20, and the conductor posts (61, 62) and conductor posts 63 (see FIG. 6) (to be described later) may be formed using any metal such as copper or nickel. In FIG. 1, these conductors are simplified and are drawn as each having a one-layer structure. However, each of these conductors may have a multilayer structure including two or more film bodies. For example, each of the conductor layers (11, 12) may have a two-layer structure including an electroless plating film and an electrolytic plating film. The conductor posts (61-63) are formed, for example, of plating metal deposited by electroless plating and/or electrolytic plating.

Each of the conductor layers (11, 12) and the conductor layers 31 may include any conductor patterns. As illustrated in FIGS. 1-3, the conductor layer 11 formed on the surface (21a) of the insulating layer 21 includes at least conductor pads (11a) (first conductor pads). In the example of FIG. 1, the conductor layer 11 further also includes conductor pads (11b) (second conductor pads), conductor pads (11d), and wirings (11e). That is, the conductor pads (11a, 11b, 11d) and the wirings (11e) are provided on the surface (21a) of the insulating layer 21. The wirings (11e) are formed by wiring patterns included in the conductor layer 11. At least one of the conductor pads (11a) and the conductor pads (11b) is connected by the wirings (11e).

The conductor posts 61 are respectively formed on the conductor pads (11a), and the conductor posts 61 are respectively connected to the conductor pads (11a). Therefore, electrodes (E1a) of the component (E1) are electrically connected to the conductor pads (11a) via the conductor posts 61. Similarly, the conductor posts 62 are respectively formed on the conductor pads (11b), and the conductor posts 62 are respectively connected to the conductor pads (11b). Therefore, electrodes (E2a) of the component (E2) are electrically connected to the conductor pads (11b) via the conductor posts 62. The conductor posts 61 protrude from surfaces of the conductor pads (11a) on the opposite side with respect to the insulating layer 21 side and penetrate the covering layer 41. Similarly, the conductor posts 62 protrude from surfaces of the conductor pads (11b) and penetrate the covering layer 41.

When the wiring substrate 100 is used, an electric component that includes a light receiving element and/or a light emitting element and has a photoelectric conversion function is mounted in the component region (A1) as the component (E1). Therefore, the component (E1) in the example of FIGS. 1-3 includes a light receiving or light emitting part (E1b) in addition to the electrodes (E1a). The electrodes (E1a) and the light receiving or light emitting part (E1b) are provided on a surface of the component (E1) facing the wiring substrate 100 side. Examples of the component (E1) include: light receiving elements such as a photodiode; and light emitting elements such as a light emitting diode (LED), an organic light emitting diode (OLED), a laser diode (LD), and a vertical cavity surface emitting laser (VCSEL). When the component (E1) is a light emitting element, the component (E1) generates light based on an electrical signal input to the electrodes (E1a) and emits light from the light receiving or light emitting part (E1b) that functions as a light emitting part. Further, when the component (E1) is a light receiving element, an electrical signal is generated based on light incident on the light receiving or light emitting part (E1b) that functions as a light receiving part and is output from the electrodes (E1a).

Further, in the example of FIG. 1, the component (E2) that can be mounted in the component region (A2) when the wiring substrate 100 is used has the electrodes (E2a) on a surface facing the wiring substrate 100 side. The component (E2) may be an electronic component such as a semiconductor device that generates an electrical signal that causes the component (E1) to emit light, and/or processes an electrical signal generated by the component (E1). Examples of the component (E2) include semiconductor devices such as a general-purpose operational amplifier, a driver IC, a microcomputer, and a programmable logic device (PLD).

The core part 51 of the optical waveguide 5 extends mainly along the optical waveguide 5 from one end side to the other end side. The core part 51 has a first end surface (5a) on which light is incident and from which light is emitted, and a second end surface (5b) that is an end surface on the opposite side with respect to the first end surface (5a) and on which light is incident and from which light is emitted. An optical connector (C) is mounted on the wiring substrate 100 of FIG. 1. The optical connector (C) and the optical waveguide 5 are positioned such that a light receiving and emitting part of the optical connector (C) and the second end surface (5b) of the core part 51 are optically coupled. Further, the optical waveguide 5 is positioned at a position where the light receiving or light emitting part (E1b) of the component (E1) and the first end surface (5a) of the core part 51 are optically coupled when the component (E1) is mounted in the component region (A1).

As illustrated in FIG. 1, an optical fiber (F) can be connected to the optical connector (C) when the wiring substrate 100 is used. As illustrated in FIGS. 1 and 2, light propagating through the optical fiber (F) is incident on the second end surface (5b) of the core part 51 via the optical connector (C), and propagates in the core part 51 to be emitted from the first end surface (5a). The light is incident on the light receiving or light emitting part (E1b) of the component (E1) and is converted into an electrical signal by the component (E1). The electrical signal is output from the electrodes (E1a), input to the component (E2), and processed by the component (E2). Conversely, an electrical signal output from the component (E2) is input to the component (E1) by a reverse path and is converted into light. The light is emitted from the light receiving or light emitting part (E1b) of the component (E1), is incident on the first end surface (5a) of the core part 51, propagates in the core part 51, and is emitted from the second end surface (5b). Then, the emitted light is incident on the optical fiber (F) and propagates to the outside.

In the example of FIGS. 1-3, as illustrated in FIG. 2, the optical waveguide 5 has two parallel core parts 51. In this way, the optical waveguide 5 provided in the wiring substrate of the embodiment can have multiple core parts 51. Further, as illustrated in FIG. 2, the multiple wirings (11e) are provided. The multiple conductor pads (11a) and the multiple conductor pads (11b) are connected by multiple parallel wirings (11e). In the present embodiment, the conductor posts 61 are respectively formed on the conductor pads (11a), and the conductor posts 62 are respectively formed on the conductor pads (11b). Therefore, it is thought that a short-circuit failure is unlikely to occur between adjacent conductor pads (11a) and between adjacent conductor pads (11b). Therefore, it may be possible that the multiple wirings (11e) can be formed, for example, at a narrow pitch such as 10 μm or less.

In the present embodiment, as illustrated in FIGS. 1 and 3, the first end surface (5a) of the core part 51 of the optical waveguide 5 faces the opposite direction with respect to the insulating layer 21 in the component region (A1), that is, the first end surface (5a) of the core part 51 of the optical waveguide 5 faces the component (E1) when the wiring substrate 100 is used, and is exposed from the optical waveguide 5. Specifically, the first end surface (5a) is exposed on a surface of the clad part 52 on the opposite side with respect to the insulating layer 21. Then, as illustrated in FIG. 3, a distance (D1) between the first end surface (5a) and the surface (21a) of the insulating layer 21 is larger than a thickness (T) of the covering layer 41. The thickness (T) of the covering layer 41 is not a thickness of a portion of the covering layer 41 covering the conductor layer 11, but is a thickness of a portion in contact with the surface (21a) of the insulating layer 21. That is, the thickness (T) of the covering layer 41 is a distance between the surface (21a) of the insulating layer 21 and a surface (upper surface) of the covering layer 41 on the opposite side with respect to the insulating layer 21.

In the present embodiment, in this way, the first end surface (5a) of the core part 51 of the optical waveguide 5 faces the opposite direction with respect to the insulating layer 21 in the component region (A1) so as to face the component (E1) when the wiring substrate 100 is used, and is exposed from the surface of the clad part 52. As described above, the optical waveguide 5 is provided in a region of the surface (21a) of the insulating layer 21 that is not covered by the covering layer 41. Then, the distance (D1) between the first end surface (5a) of the core part 51 and the surface (21a) of the insulating layer 21 is larger than the distance (the thickness (T) of the covering layer 41) between the surface (21a) of the insulating layer 21 and the upper surface of the covering layer 41. Therefore, it may be possible that the light receiving or light emitting part (E1b) of the component (E1) positioned at least partially on the covering layer 41 and the first end surface (5a) of the core part 51 can be brought close to each other. Further, the first end surface (5a) of the core part 51 can face the light receiving or light emitting part (E1b) without intervention of the clad part 52 when the wiring substrate 100 is used.

Therefore, it is thought that the core part 51 of the optical waveguide 5 and the light receiving or light emitting part (E1b) of the component (E1) can be optically coupled with a high coupling efficiency. It is thought that light can propagate between the optical waveguide 5 and the component (E1) with less loss.

Furthermore, in the present embodiment, the conductor posts 61 penetrating the covering layer 41 are formed on the conductor pads (11a). Therefore, a distance between conductors that are to be physically connected for electrical connection between the electrodes (E1a) of the component (E1), which is mounted above the optical waveguide 5 (on the opposite side with respect to the insulating layer 21), and the conductor pads (11a) (an insulation distance between the electrodes (E1a) and the conductor pads (11a)) can be shortened. That is, the insulation distance between the electrodes (E1a) and the conductor pads (11a) can be shortened as compared to a case where the conductor posts 61 are not formed. Therefore, it is thought that connection reliability between the component (E1) and the wiring substrate 100 is improved.

In particular, in the examples of FIGS. 1-3, the conductor posts 61 protrude from the surface of the covering layer 41 on the opposite side with respect to the insulating layer 21. Therefore, the insulation distance between the electrodes (E1a) and the conductor pads (11a) can be further shortened, and the connection reliability between the component (E1) and the wiring substrate 100 may be further improved.

Further, when solder bumps or the like are used for mounting the component (E1) on the wiring substrate 100, since the conductor posts 61 are provided, it is thought that small solder bumps, that is, solder bumps with low heights and narrow widths can be used. Therefore, it may be possible that the conductor pads (11a) are formed closer to each other as compared to the case where the conductor posts 61 are not formed. Therefore, it may be possible that a component (E1) having multiple electrodes (E1a) positioned at a narrower pitch can be mounted. Further, it may be possible that the wirings (11e) (see FIGS. 1 and 2) are formed at a narrow pitch. Further, since a change in impedance due to bumps is smaller as compared to a case where large bumps are used, it may be possible that better high frequency transmission characteristics are obtained.

In this way, according to the present embodiment, it may be possible that the core part of the optical waveguide, which is provided on the surface of the insulating layer having the conductor pads, and a component connected to the conductor pads can be optically coupled with a high coupling efficiency, and the component and the conductor pads can be electrically connected with good connection quality. Further, it may be possible that it can contribute to realization of densification and good high frequency characteristics of the wiring substrate.

With reference to FIG. 3, the optical waveguide 5 and the conductor posts 61 are further described. The description with respect to the conductor posts 61 can also be applied to the conductor posts 62. As illustrated in FIG. 3, the core part 51 of the optical waveguide 5 includes a first portion (51a) extending along the surface (21a) of the insulating layer 21, a bent second portion (51b) connected to the first portion (51a), and a third portion (51c) connected to the second portion (51b). The second portion (51b) bends from a direction in which the first portion (51a) extends along the surface (21a) of the insulating layer 21 toward the opposite direction with respect to the insulating layer 21. The core part 51 has an inclined surface 511 in the second portion (51b). The inclined surface 511 is inclined with respect to each of the first portion (51a) and the third portion (51c), and is preferably inclined at an angle of 45 degrees. The third portion (51c) extends from the second portion (51b) in the opposite direction with respect to the insulating layer 21, and has the first end surface (5a) at an end part on the opposite side with respect to the insulating layer 21, that is, an end part on the opposite side with respect to the second portion (51b).

Light propagating through the first portion (51a) along the surface (21a) is reflected in the second portion (51b) by the inclined surface 511 toward the opposite side with respect to the insulating layer 21, and propagates in the third portion (51c) towards the first end surface (5a). Further, light propagating through the third portion (51c) toward the insulating layer 21 is reflected in the second portion (51b) by the inclined surface 511 in a direction along the surface (21a), and propagates in the first portion (51a) towards the second end surface (5b) (see FIG. 1). At the inclined surface 511, it is possible that light with a small incident angle at an interface between the core part 51 and the clad part 52 cannot be totally reflected. However, by appropriately increasing a difference in refractive index between the core part 51 and the clad part 52, more light can be totally reflected. Examples of a method for forming the optical waveguide 5 having the core part 51 having such a bent part include a Mosquito method, in which a needle is caused to scan in a clad while a material for forming the core part is discharged, an imprint method, and the like.

In the example of FIG. 3, the first end surface (5a) of core part 51 is substantially parallel to the surface (21a) of the insulating layer 21. It is thought that the component (E1) is mounted such that a light receiving or light emitting surface (E1c) of the light receiving or light emitting part (E1b) is substantially parallel to the surface (21a) of the insulating layer 21. Therefore, the first end surface (5a), which is substantially parallel to the surface (21a) of the insulating layer 21, can face the light receiving or light emitting surface (E1c) of the component (E1) in a substantially mutually parallel state. Therefore, it is thought that the core part 51 and the component (E1) are optically coupled with a high coupling efficiency as compared to a case where the first end surface (5a) is inclined with respect to the surface (21a) of the insulating layer 21.

Further, in the example of FIGS. 1-3, each of the conductor posts 61 has an end surface (61a) facing substantially the same direction as the first end surface (5a) at an end part on the opposite side with respect to the conductor pads (11a) side. In other words, the end surface (61a) of each of the conductor posts 61 and the first end surface (5a) are substantially parallel to each other, and therefore, the end surface (61a) is substantially parallel to the surface (21a) of the insulating layer 21. It is thought that the electrodes (E1a) and the light receiving or light emitting part (E1b) of the component (E1) are formed such that a connection surface (E1d) of each of the electrodes (E1a) and the light receiving or light emitting surface (E1c) of the light receiving or light emitting part (E1b) are substantially parallel to each other. Further, it is thought that the component (E1) is mounted such that the connection surface (E1d) of each of the electrodes (E1a) is substantially parallel to the surface (21a) of the insulating layer 21. Since each of the conductor posts 61 has the end surface (61a) that is substantially parallel to the first end surface (5a), it is thought that the core part 51 and the component (E1) are optically coupled with a high coupling efficiency, and the component (E1) and the conductor posts 61 are stably connected.

Each of the conductor posts 61 in the example of FIG. 3 has a substantially constant width from the conductor pads (11a) side to the opposite side with respect to the conductor pads (11a) side, that is, to the side facing the component (E1) when the wiring substrate 100 is used. Further, each of the conductor posts 61 is integrally formed. That is, in the example of FIG. 3, each of the conductor posts 61 is entirely integrally formed. For example, an interface between different materials or an interface between regions with different formation times is not included in each of the conductor posts 61. In this way, it is thought that, in the conductor posts 61, each of which is entirely integrally formed with a substantially constant width, a crack or interface peeling due to stress concentration is unlikely to occur.

As illustrated in FIGS. 1 and 3, the wiring substrate 100 of FIGS. 1-3 further includes a connection layer 7. The connection layer 7 is formed on the end surfaces (61a) of the conductor posts 61. The connection layer 7 is formed of a material having a lower melting point than the conductor posts 61. Therefore, the connection layer 7 can contribute to the connection between conductor posts 61 (or the conductor posts 62) and the component (E1) (or the component (E2)). Examples of the material of the connection layer 7 include tin-based solder, gold-based solder, and the like. In the wiring substrate 100 including the connection layer 7, when the component (E1) or the component (E2) is mounted, it may be possible that supply of a bonding material such as solder can be omitted.

In the example of FIG. 3, a distance (D2) between the end surface (61a) of each of the conductor posts 61 and the surface (21a) of the insulating layer 21 is shorter than the distance (D1) between the first end surface (5a) of the core part 51 of the optical waveguide 5 and the surface (21a) of the insulating layer 21. Therefore, it is thought that proximity between the first end surface (5a) of the core part 51 and the light receiving or light emitting part (E1b) of the component (E1) is unlikely to be hindered by the contact between the conductor posts 61 and the electrodes (E1a) of the component (E1). Therefore, it is thought that a good coupling efficiency in optical coupling between the optical waveguide 5 and the component (E1) can be stably and easily obtained.

On the other hand, a distance (D3) between at least a part of a surface of the connection layer 7 on the opposite side with respect to the conductor posts 61 and the surface (21a) of the insulating layer 21 is longer than the distance (D1) between the first end surface (5a) and the surface (21a) of the insulating layer 21. Specifically, at least at an uppermost part of the surface of the connection layer 7 (a portion most distant from the surface (21a) of the insulating layer 21), the distance (D3) is larger than the distance (D1). That is, at least a part of the connection layer 7 protrudes from the first end surface (5a) of the core part 51 to the opposite side with respect the insulating layer 21, that is, to the component (E1) side when the wiring substrate 100 is used. Therefore, it is thought that, when the component (E1) is mounted on the wiring substrate 100, the connection layer 7 and the electrodes (E1a) of the component (E1) can be easily brought into contact with each other, and therefore, the conductor posts 61 and the electrodes (E1a) can be substantially reliably connected. The connection layer 7 can melt when the component (E1) is mounted, and thus, is unlikely to hinder the proximity between the first end surface (5a) of the core part 51 and the light receiving or light emitting part (E1b) of the component (E1).

Figure 4:
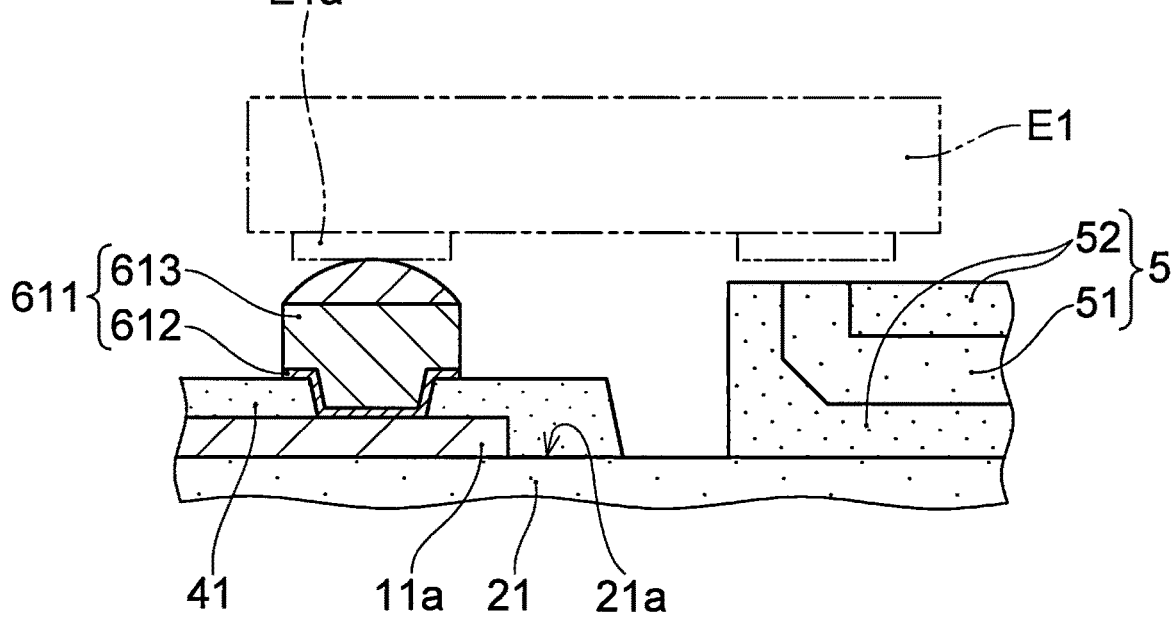
FIG. 4 is an enlarged view illustrating a modified embodiment of a conductor post in the embodiment of the present invention.

FIG. 4 illustrates conductor posts 611, which are a modified embodiment of the conductor posts 61 of FIGS. 1-3. As illustrated in FIG. 4, each of the conductor posts 611 has a two-layer structure including a lower layer 612 and an upper layer 613. The lower layer 612 is, for example, a metal film formed by electroless plating or sputtering. The upper layer 613 is, for example, an electrolytic plating film formed by electrolytic plating using the lower layer 612 as a power feeding layer. Each of the conductor posts 611 has in the covering film 41 a tapered portion that tapers toward a conductor pad (11a). Therefore, in the example of FIG. 4 having the conductor posts 611, it may be possible that the conductor posts 611 can be connected to the electrodes (E1a) of the component (E1) with areas larger than areas of the conductor pads (11a). Further, as will be described later, it is thought that the conductor posts 611 are formed in fewer processes than the conductor posts 61 in the example of FIGS. 1-3.

Figure 5A:
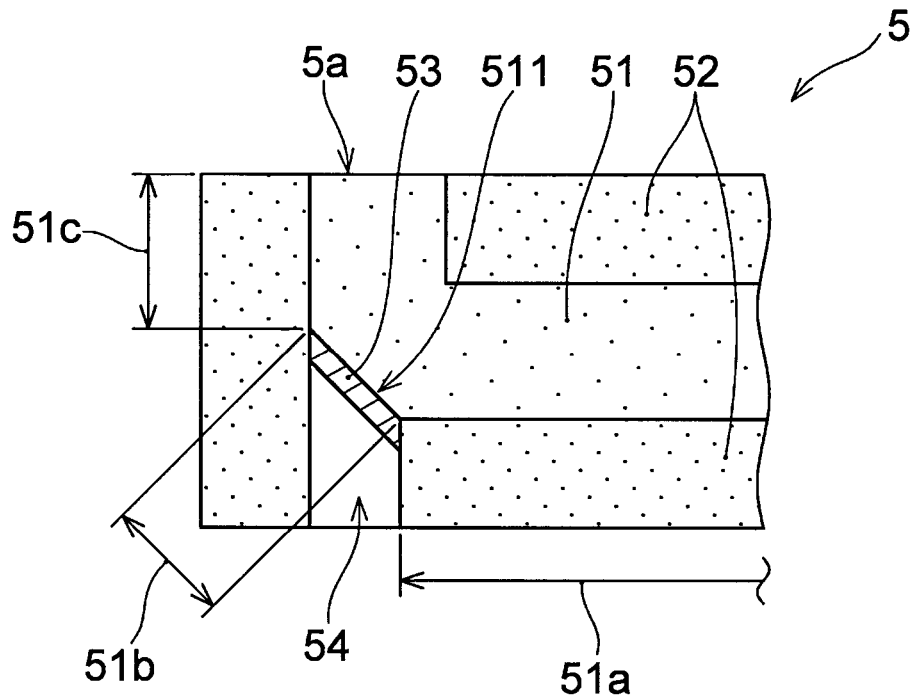
FIG. 5A is an enlarged view illustrating a modified embodiment of an optical waveguide in the embodiment of the present invention.
Figure 5B:
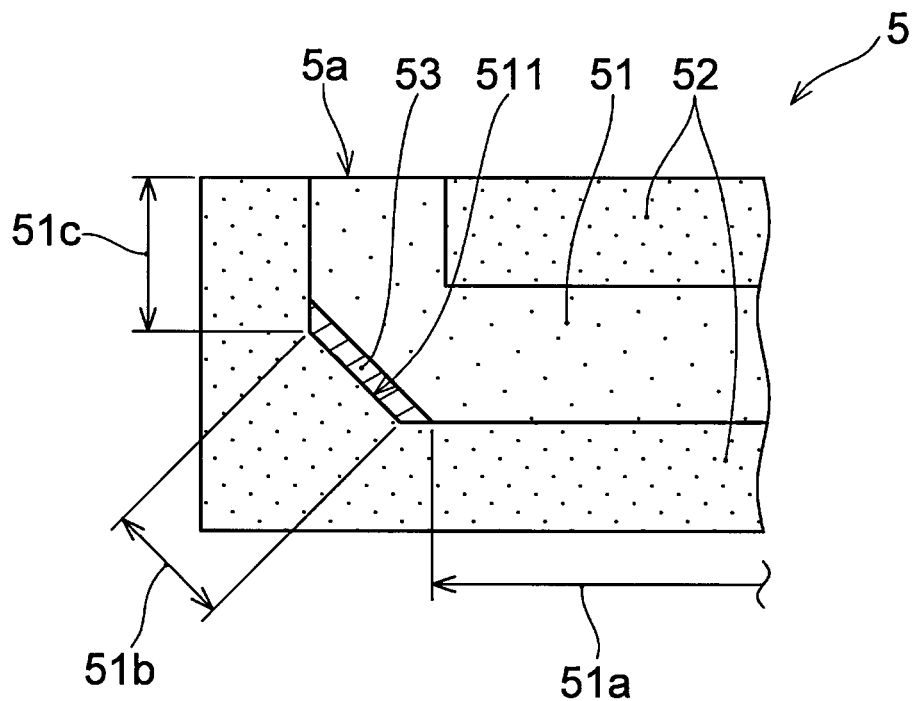
FIG. 5B is an enlarged view illustrating another modified embodiment of the optical waveguide in the embodiment of the present invention.

Each of FIGS. 5A and 5B illustrates a modified embodiment of the optical waveguide 5. The optical waveguide 5 illustrated in each of FIGS. 5A and 5B has a reflector 53 on the inclined surface 511 at a bent part of the second portion (51b). The reflector 53 is a metal film formed of, for example, aluminum, silver, gold, or the like. Light incident on the reflector 53 can be substantially totally reflected regardless of an incident angle. The reflector 53 is preferably formed so as to be inclined substantially 45 degrees with respect to each of the directions in which the first portion (51a) and the third portion (51c) extend. By doing so, light propagating from each of the first portion (51a) and the third portion (51c) can be efficiently caused to propagate to the first end surface (5a) or the second end surface (5b) (see FIG. 1).

In the example of FIG. 5A, a surface of the optical waveguide 5 on the opposite side with respect to a surface on which the first end surface (5a) is exposed has a recess 54 that reaches the inclined surface 511 of the core part 51. And, the reflector 53 is provided on the inclined surface 511 exposed on a bottom surface of the recess 54, that is, on the recess 54 side of an interface between the recess 54 and the second portion (51b). The reflector 53 is formed inside the recess 54.

In the example of FIG. 5B, the recess 54 of the example of FIG. 5A is not provided. The reflector 53 in the example of FIG. 5B is formed along the inclined surface 511 and is interposed between the core part 51 and the clad part 52. As will be described later, methods for forming the reflectors 53 that are respectively illustrated in FIGS. 5A and 5B are different from each other. The wiring substrate of the embodiment can have a reflector 53 formed using a method suitable for a manufacturing environment thereof.

Figure 6:
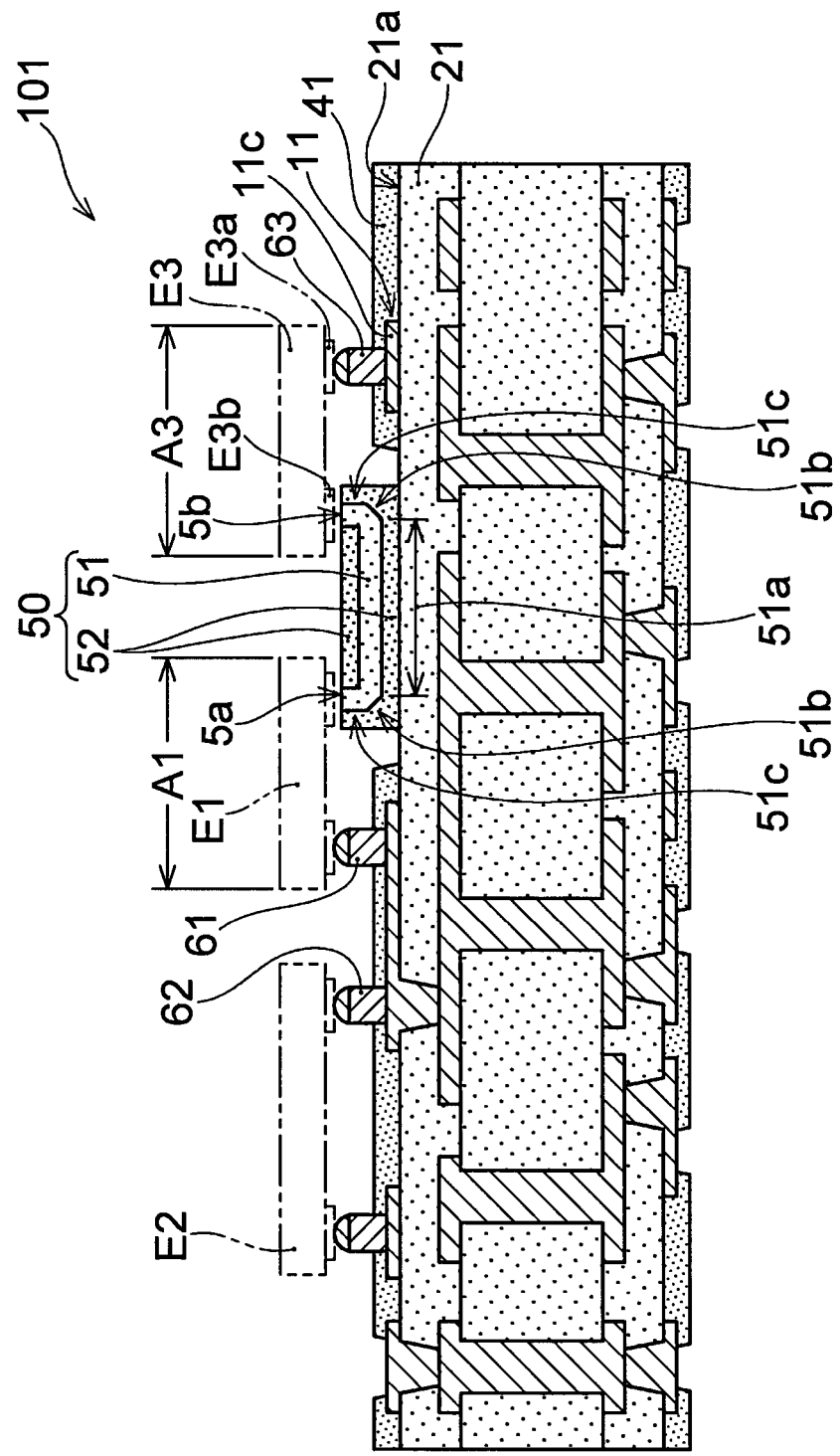
FIG. 6 is a cross-sectional view illustrating an example of a wiring substrate according to another embodiment of the present invention.

FIG. 6 illustrates a wiring substrate 101, which is an example of a wiring substrate of another embodiment. Except for items described below, the wiring substrate 101 is formed of the same structural elements as the wiring substrate 100 illustrated in FIG. 1 and the like, and has the same structure as the wiring substrate 100. A structural element that is the same as a structural element of the wiring substrate 100 is indicated in FIG. 6 using the same reference numeral symbol as in FIG. 1, or is omitted as appropriate in FIG. 6, and repeated description thereof is omitted.

As illustrated in FIG. 6, instead of the optical waveguide 5 provided in the wiring substrate 100 of FIG. 1, the wiring substrate 101 includes an optical waveguide 50 that includes a core part 51 having a first end surface (5a) and a second end surface (5b) exposed in the same direction. Further, in the wiring substrate 101, the conductor layer 11 includes conductor pads (11c) (third conductor pads). That is, the third conductor pads (11c) are further provided on the surface (21a) of the insulating layer 21. The conductor posts 63 are respectively formed on the conductor pads (11c), and the conductor posts 63 are respectively connected to the conductor pads (11c). Similar to the conductor posts (61, 62), each of the conductor posts 63 is a conductor having a columnar, frustum-like, or inverted frustum-like shape extending from the conductor layer 11 in the opposite direction with respect the insulating layer 21. The conductor posts 63 protrude from upper surfaces of the conductor pads (11c) and penetrate the covering layer 41.

As illustrated in FIG. 6, when the wiring substrate 101 is used, an external component (E3) is connected to the conductor posts 63. Specifically, electrodes (E3a) of the component (E3) and the conductor posts 63 are connected. Therefore, the component (E3) is electrically connected to the conductor pads (11c) via the conductor posts 63. Further, the wiring substrate 101 includes a component region (A3) (third component region), which is a region to be covered by the component (E3) when the wiring substrate 101 is used. The component (E3) is positioned in the component region (A3). The component (E3) is mounted on the opposite side of the conductor posts 63 and the optical waveguide 50 with respect to the insulating layer 21 side.

Similar to the component (E1), the component (E3) is an electrical component that includes a light receiving element and/or a light emitting element and has a photoelectric conversion function, and the light receiving element or the light emitting element described above regarding the component (E1) is mounted on the wiring substrate 101 as the component (E3). Therefore, the component (E3) includes a light receiving or light emitting part (E3b) in addition to the electrodes (E3a). The electrodes (E3a) and the light receiving or light emitting part (E3b) are provided on a surface of the component (E3) facing the wiring substrate 101 side.

Similar to the optical waveguide 5 in the example of FIG. 1, the optical waveguide 50 is provided in a region of the surface (21a) of the insulating layer 21 that is not covered by the covering layer 41, and includes a core part 51 and a clad part 52. The core part 51 and the clad part 52 of the optical waveguide 50 may be formed of an organic or inorganic material, or a mixed material thereof as described above regarding the material of the core part 51 and the clad part 52 of the optical waveguide 5.

Similar to the optical waveguide 5 in FIG. 1, the core part 51 of the optical waveguide 50 has a first end surface (5a) that faces the opposite direction with respect to the insulating layer 21 and is exposed from the optical waveguide 50 in the component region (A1). And, the core part 51 of the optical waveguide 50 has a second end surface (5b) at an end part on the opposite side with respect to an end part on the first end surface (5a) side. The second end surface (5b) faces the same direction as the first end surface (5a) and is exposed from the optical waveguide 50. Therefore, the core part 51 of the optical waveguide 50 includes a first portion (51a) extending along the surface (21a) of the insulating layer 21, two second portions (51b) that are respectively connected to two ends of the first portion (51a), and two third portions (51c) that are respectively connected to the two second portions (51b). Each of the two second portions (51b) bends from a direction along the surface (21a) toward the opposite direction with respect to the insulating layer 21. Further, the two third portions (51c) respectively extend from the second portions (51b) in the opposite direction with respect to the insulating layer 21. At end parts on the opposite side with respect to the second portions (51b), that is, at end parts on the opposite side with respect to the insulating layer 21, one of the two third portions (51c) has the first end surface (5a) and the other has the second end surface (5b).

The second end surface (5b) of the core part 51 of the optical waveguide 50 faces the same direction as the first end surface (5a) facing in the opposite direction with respect to the insulating layer 21, and is exposed from the optical waveguide 50 in the component region (A3). That is, the second end surface (5b) is exposed from the optical waveguide 50 so as to face the component (E3) when the wiring substrate 101 is used. The second end surface (5b) is positioned so as to face the light receiving or light emitting part (E3b) of the component (E3) when the wiring substrate is used. Also in the wiring substrate 101, the distance between the first end surface (5a) and the surface (21a) of the insulating layer 21 is larger than the thickness of the covering layer 41. The second end surface (5b) is preferably substantially flush with the first end surface (5a). Therefore, a distance between the second end surface (5b) and the surface (21a) of the insulating layer 21 may be larger than the thickness of the covering layer 41. Therefore, it may be possible that the second end surface (5b) of the optical waveguide 50 and the light receiving or light emitting part (E3b) of the component (E3) can be optically coupled with a high coupling efficiency.

Further, since the conductor posts 63 that penetrate the covering layer 41 and protrude from the surface of the covering layer 41 are formed on the conductor pads (11*c*), it may be possible that connection reliability between the component (E3) and the wiring substrate 101 is increased. Further, it may be possible that densification and good high frequency characteristics of the wiring substrate are realized.

Next, a method for manufacturing the wiring substrate of the embodiment is described with reference to FIGS. 7A-7H using the wiring substrate 100 of FIG. 1 as an example.

Figure 7A:
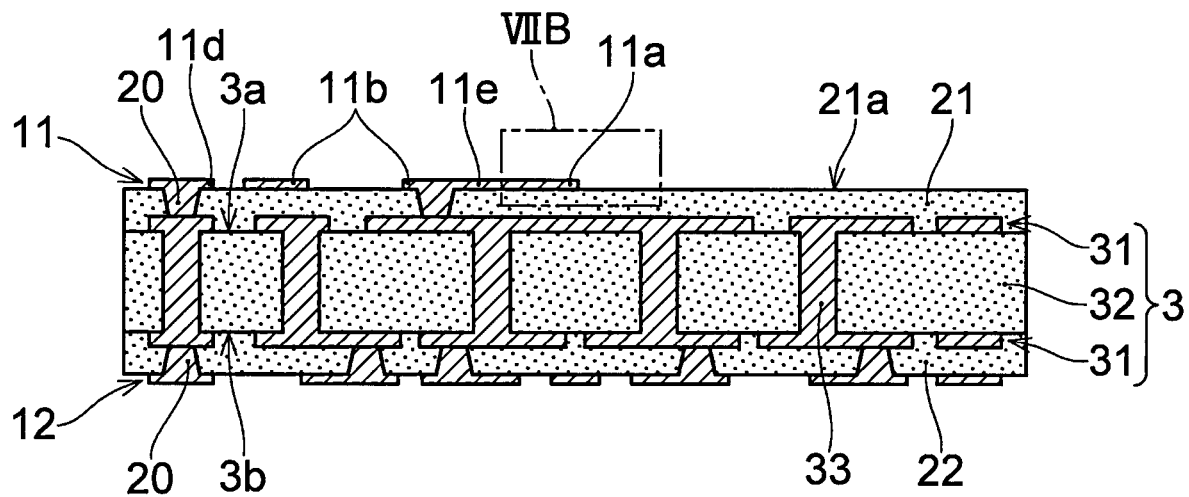
FIG. 7A is a cross-sectional view illustrating an example of a manufacturing process of a wiring substrate according to an embodiment of the present invention.

As illustrated in FIG. 7A, the insulating layers (21, 22) and the conductor layers (11, 12) are formed on both sides of the core substrate 3. For example, the conductor layers 31, which have desired conductor patterns, and the through-hole conductors 33 are formed using a subtractive method on or in a double-sided copper-clad laminated substrate including an insulating layer that is to become the insulating layer 32 of the core substrate 3. Then, the insulating layer 21 is formed on the first surface (3*a*) of the core substrate 3, and the insulating layer 22 is formed on the second surface (3*b*) of the core substrate 3. Each of the insulating layer 21 and the insulating layer 22 is formed, for example, by laminating and thermocompression bonding a film-like epoxy resin on the core substrate 3. Through holes for forming the via conductors 20 are formed in the insulating layers, for example, by irradiation with CO2 laser or the like. Then, the conductor layer 11 is formed on the surface (21*a*) of the insulating layer 21, and the conductor layer 12 is formed on the insulating layer 22. The conductor layer 11 is formed to include the conductor pads (11*a*, 11*b*, 11*d*) and the wirings (11*e*). Each of the conductor layer 11 and the conductor layer 12 is formed using, for example, a semi-additive method.

Figure 7B:
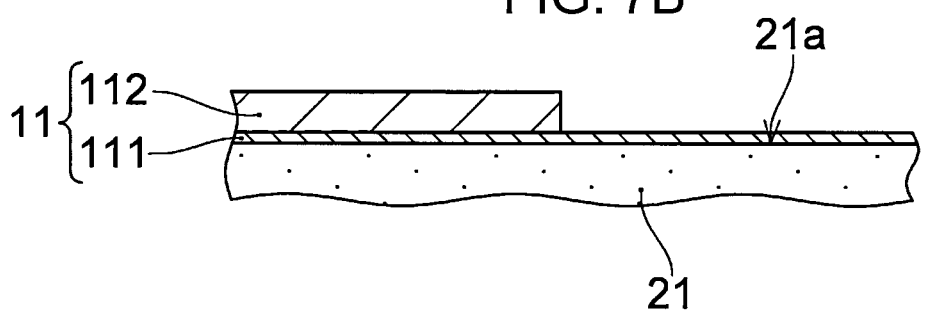
FIG. 7B is a cross-sectional view illustrating an example of a manufacturing process of a wiring substrate according to an embodiment of the present invention.

FIG. 7B illustrates an enlarged view of a portion (VIIB) of FIG. 7A. In the formation of the conductor layer 11 and the like using a semi-additive method, as illustrated in FIG. 7B, for example, a metal film 111 is formed on the surface (21*a*) of the insulating layer 21 by electroless plating or sputtering. A plating film 112 is formed by pattern plating including electrolytic plating using the metal film 111 as a power feeding layer.

Figure 7C:
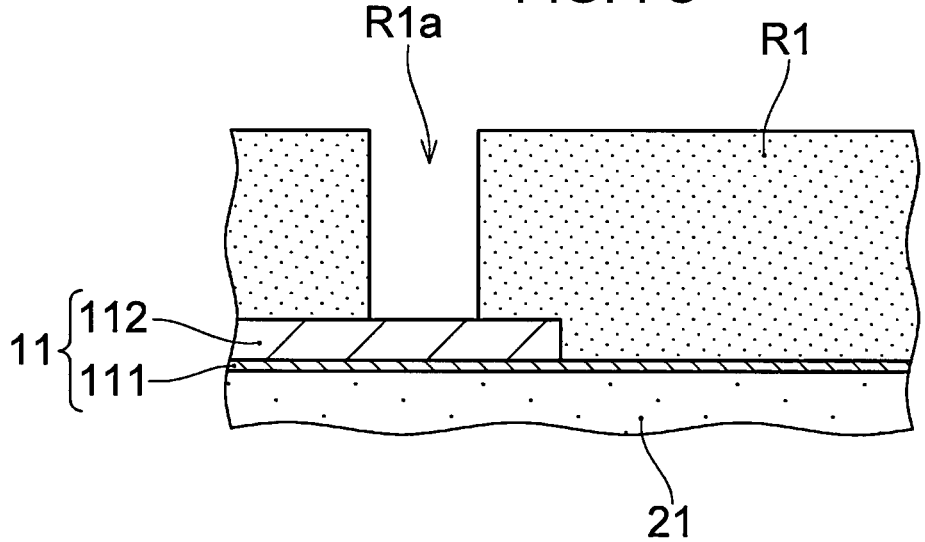
FIG. 7C is a cross-sectional view illustrating an example of a manufacturing process of a wiring substrate according to an embodiment of the present invention.
Figure 7D:
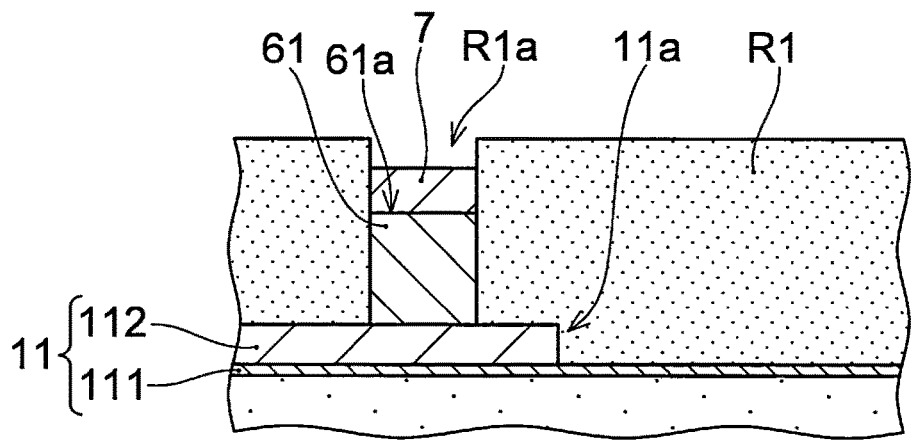
FIG. 7D is a cross-sectional view illustrating an example of a manufacturing process of a wiring substrate according to an embodiment of the present invention.
Figure 7E:
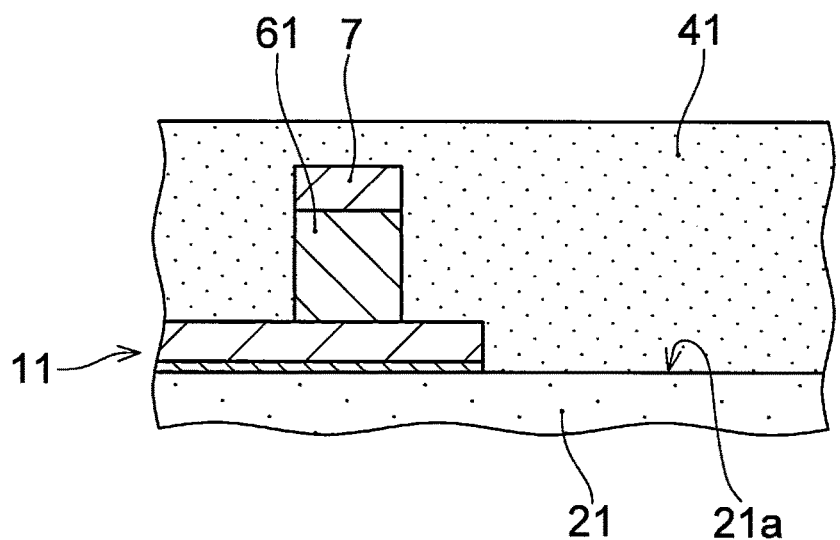
FIG. 7E is a cross-sectional view illustrating an example of a manufacturing process of a wiring substrate according to an embodiment of the present invention.

In a case where the wiring substrate 100 of FIG. 1 is manufactured, after the formation of the plating film 112 by pattern plating, a plating resist (not illustrated in the drawings) used for the pattern plating is removed, and then, the conductor posts (61, 62) (see FIG. 1) are formed with the metal film 111 entirely remaining. Using the conductor posts 61 as an example, a method for forming the conductor posts (61, 62) is described below with reference to FIGS. 7C-7E. FIGS. 7C-7E illustrate the same portion as the portion illustrated in FIG. 7B.

As illustrated in FIG. 7C, on the conductor layer 11 and the insulating layer 21, a platting resist (R1) having openings (R1*a*) at formation sites of the conductor posts 61 is formed. For example, the plating resist (R1) contains a photosensitive resin and the openings (R1*a*) are formed by exposure and development.

As illustrated in FIG. 7D, in the openings (R1*a*), the conductor posts 61 are respectively formed by electrolytic plating using the metal film 111 as a power feeding layer. The conductor posts 61 are formed so as to have a height allowing the conductor posts 61 to penetrate the covering layer 41 when the formation of the covering layer 41 is completed in a subsequent process (see FIG. 7G), preferably, a height allowing the conductor posts 61 to protrude from the upper surface of the covering layer 41.

Further, as illustrated in FIG. 7D, the connection layer 7 is formed on the end surfaces (61*a*) of the conductor posts 61. As the connection layer 7, for example, a metal film formed of tin, a tin alloy, a gold alloy, or the like is formed. The connection layer 7 may be formed by electrolytic plating using the metal film 111 as a power feeding layer. After the formation of the connection layer 7, the plating resist (R1) is removed using a suitable peeling agent. Then, a portion of the metal film 111 that is exposed by the removal of the plating resist (R1), that is, a portion that is not covered by the plating film 112 is removed by, for example, quick etching. The conductor patterns of the conductor layer 11, such as the conductor pads (11*a*), are physically and electrically separated from other conductor patterns.

Figure 7F:
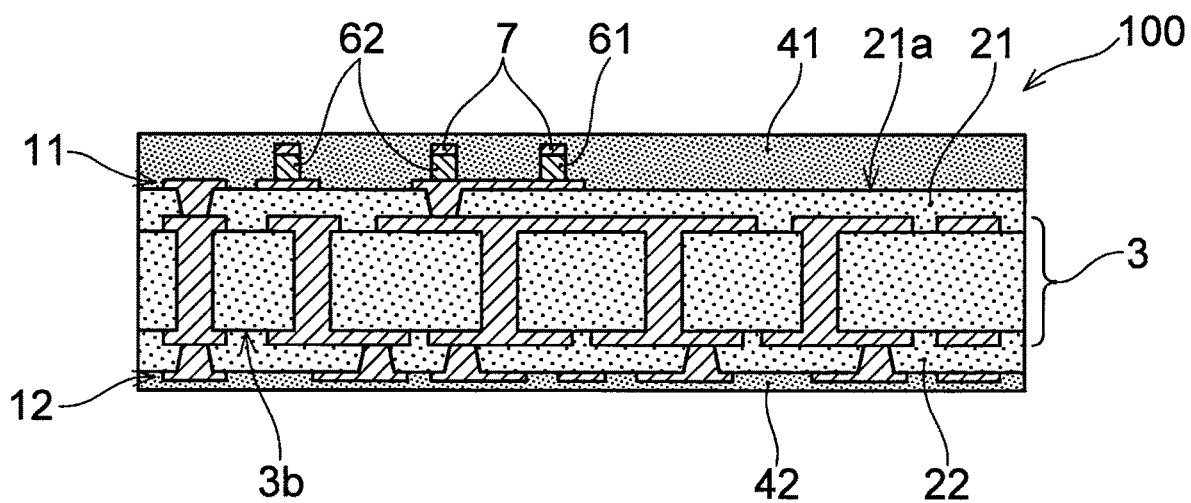
FIG. 7F is a cross-sectional view illustrating an example of a manufacturing process of a wiring substrate according to an embodiment of the present invention.

As illustrated in FIGS. 7E and 7F, the covering layer 41 covering the insulating layer 21 and the conductor layer 11, the conductor posts (61, 62), and the connection layer 7 is formed. Similar to FIG. 7E, FIG. 7F illustrates a state of the entire wiring substrate 100 after the formation of the covering layer 41. At the stage illustrated in FIGS. 7E and 7F, the covering layer 41 is formed so as to cover all the structural elements on the surface (21*a*) of the insulating layer 21, including the conductor posts (61, 62) and the connection layer 7.

The covering layer 41 is formed, for example, by supplying a liquid or sheet-like epoxy resin or polyimide resin or the like onto the surface (21*a*) of the insulating layer 21 and the structural elements on the surface (21*a*) using a method such as printing, coating, spraying, or laminating. It is also possible that the covering layer 41 is formed by injection molding using an appropriate mold. Further, it is also possible that a photosensitive epoxy resin or polyimide resin may be used. When necessary, the covering layer 41 is fully cured or temporarily cured by heating, UV irradiation, or the like. As illustrated in FIG. 7F, on the second surface (3*b*) side of the core substrate 3, the solder resist 42 is formed by coating or laminating an epoxy resin or polyimide resin, and the conductor layer 12 and the insulating layer 22 are entirely covered by the solder resist 42.

Figure 7G:
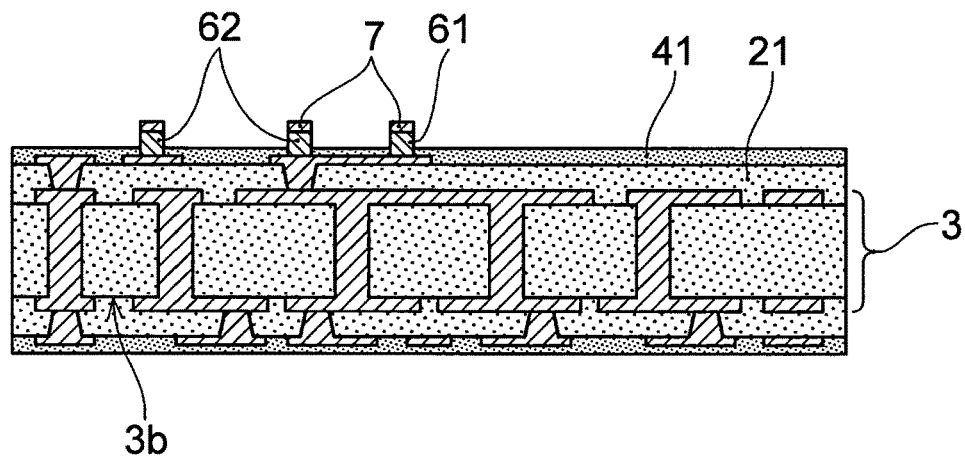
FIG. 7G is a cross-sectional view illustrating an example of a manufacturing process of a wiring substrate according to an embodiment of the present invention.

As illustrated in FIG. 7G, a portion of the covering layer 41 in the thickness direction is removed such that the end parts of the conductor posts (61, 62) on the opposite side with respect to the insulating layer 21 are exposed together with the connection layer 7 from the covering layer 41. Specifically, a portion of the covering layer 41 having a predetermined thickness from a surface of the covering layer 41 on the opposite side with respect to the insulating layer 21 is completely removed. Due to the reduction in the thickness of the covering layer 41, the end parts of the conductor posts (61, 62) on the opposite side with respect to the insulating layer 21 are exposed from the covering layer 41.

A portion of the covering layer 41 in the thickness direction can be removed, for example, by dry etching such as plasma etching using a carbon tetrafluoride (CF4) gas. Further, it is also possible that a portion of the covering layer 41 is removed by blasting. Although not illustrated in the drawings, surfaces on the second surface (3*b*) side of the core substrate 3 may be protected, for example, by applying a protective film such as a film formed of polyethylene terephthalate (PET) during the formation of the conductor posts (61, 62) and/or during the removal of a portion of the covering layer 41.

Figure 7H:
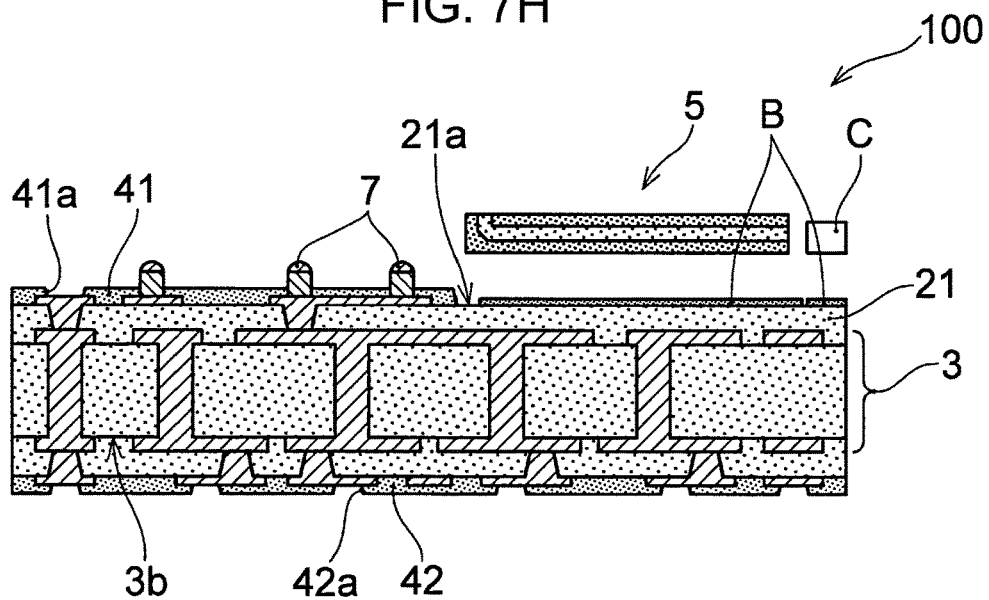
FIG. 7H is a cross-sectional view illustrating an example of a manufacturing process of a wiring substrate according to an embodiment of the present invention.

As illustrated in FIG. 7H, a portion of the covering layer 41 corresponding to a region where the optical waveguide 5 and the optical connector (C) are to be provided is removed by, for example, irradiation with CO2 laser or the like. A region of the surface (21*a*) of the insulating layer 21 where the optical waveguide 5 and the optical connector (C) are provided is exposed. By the laser processing, the openings (41a) can be formed. Further, on the second surface (3b) side of the core substrate 3, the openings (42a) are formed in the solder resist 42 by exposure and development or by laser processing.

As described above, the optical waveguide 5 is formed by using, for example, a Mosquito method, an imprint method, or the like. Further, any suitable optical connector (C) according to an intended use of the wiring substrate 100 is prepared. For example, any adhesive (B), such as a thermosetting, room temperature curable, or photocurable adhesive, is supplied to a predetermined portion of the surface (21a) of the insulating layer 21 exposed from the covering layer 41, and the optical waveguide 5 and the optical connector (C) are positioned on the adhesive (H). When necessary, a curing treatment of the adhesive (B) by heating or the like is performed, and the optical waveguide 5 and the optical connector (C) are fixed. Further, the connection layer 7 is once melted by a reflow process or the like and is shaped into a hemispherical shape. Through the above processes, the wiring substrate 100 in the example of FIG. 1 is completed.

In a case where the conductor posts 611 of the modified embodiment illustrated in FIG. 4 referenced above are formed, from the state illustrated in FIGS. 7A and 7B, the exposed portion of the metal film 111 is removed by, for example, quick etching. That is, before the formation of the conductor posts 611, the conductor patterns of the conductor layer 11 such as the conductor pads (11a) are separated from other conductor patterns.

Figure 8A:
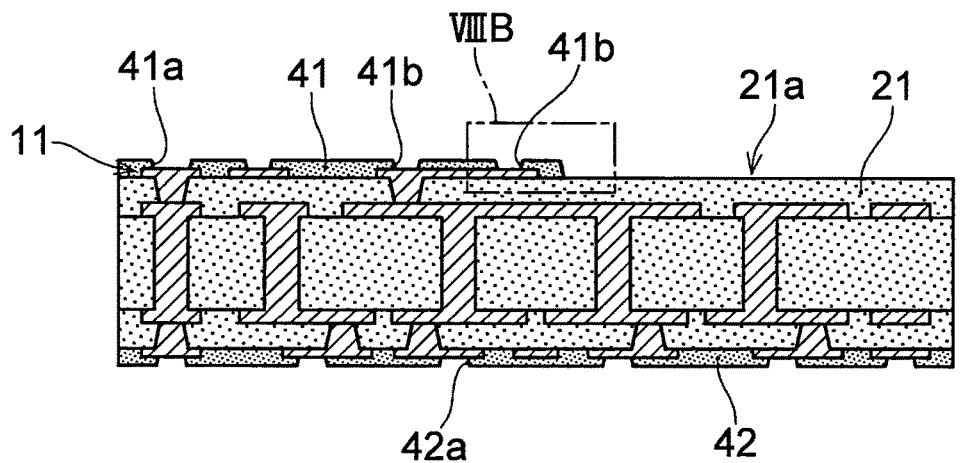
FIG. 8A is a cross-sectional view illustrating an example of a manufacturing process of the conductor post in the modified embodiment illustrated in FIG. 4.

Then, as illustrated in FIG. 8A, the covering layer 41 and the solder resist 42 are formed. The covering layer 41 and the solder resist 42 may be formed using the same methods as those described with reference to FIGS. 7E and 7F. Then, for example, by exposure and development, or laser processing, or the like, the openings (41a) and openings (41b) are formed in the covering layer 41, and a portion of the covering layer 41 corresponding to a region where the optical waveguide 5 and the optical connector (C) (see FIG. 1) are to be provided is removed. The openings (41b) are formed at positions where the conductor posts 611 are formed. Similarly, also in the solder resist 42, the openings (42a) are formed, for example, by exposure and development.

Figure 8B:
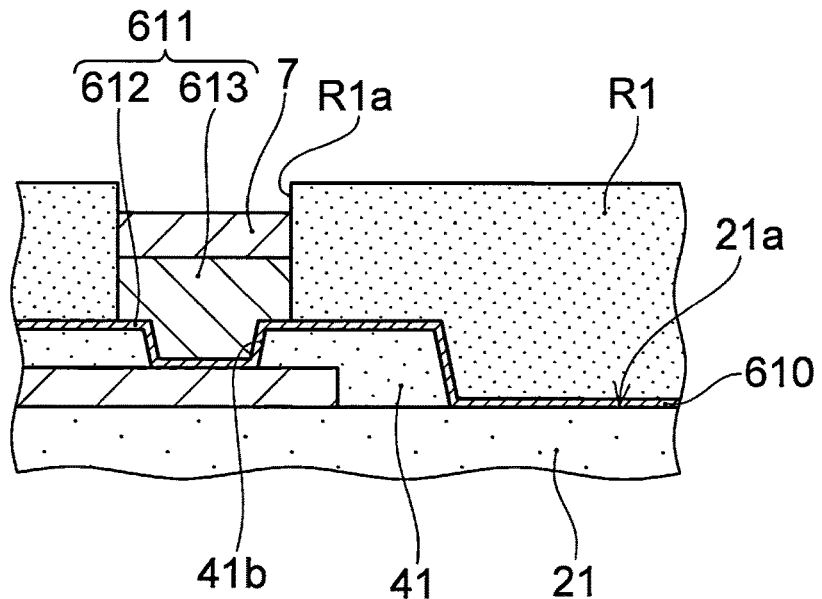
FIG. 8B is a cross-sectional view illustrating an example of a manufacturing process of the conductor post in the modified embodiment illustrated in FIG. 4.

Then, as illustrated in FIG. 8B, a metal film 610 forming the lower layer 612 of the conductor posts 611 is formed, for example, by electroless plating or sputtering. FIG. 8B illustrates an enlarged view of a portion corresponding to a portion (VIIIB) of FIG. 8A. The metal film 610 is formed on the covering layer 41, on inner wall surfaces of the openings (41b), and on the surface (21a) of the insulating layer 21 that is not covered by the covering layer 41. Then, a plating resist (R1) having openings (R1a) exposing the openings (41b) at formation positions of the conductor posts 611 is formed. Although not illustrated in the drawings, the plating resist (R1) is formed so as to also cover the openings (41a) of the covering layer 41 (see FIG. 8A).

In the openings (R1a) and the openings (41b), a metal forming the upper layer 613 is formed by electrolytic plating. The metal film 610 may be used as a power feeding layer. As a result, the conductor posts 611 each having a two-layer structure including the lower layer 612 and the upper layer 613 are formed. Further, by electrolytic plating using the metal film 610 as a power feeding layer, a metal film formed of tin, a tin alloy, a gold alloy, or the like is formed as the connection layer 7.

After that, the plating resist (R1) is removed, and the metal film 610 exposed by the removal of the plating resist (R1) is removed by quick etching or the like. Through the above processes, the conductor posts 611 in the example of FIG. 4 can be formed. In the method for forming the conductor posts 611 illustrated in FIGS. 8A and 8B, since it is not necessary to remove a portion of the covering layer 41 in the thickness direction, it may be possible that it is easier than forming the conductor posts 61 and the covering layer 41 in the example of FIG. 1.

Figure 9A:
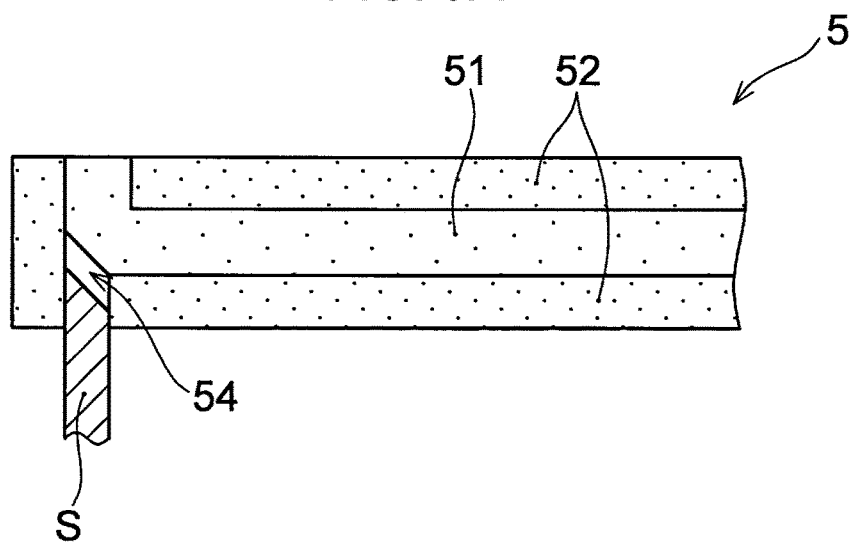
FIG. 9A is a cross-sectional view illustrating an example of a manufacturing process of the optical waveguide in the modified embodiment illustrated in FIG. 5A.
Figure 9B:
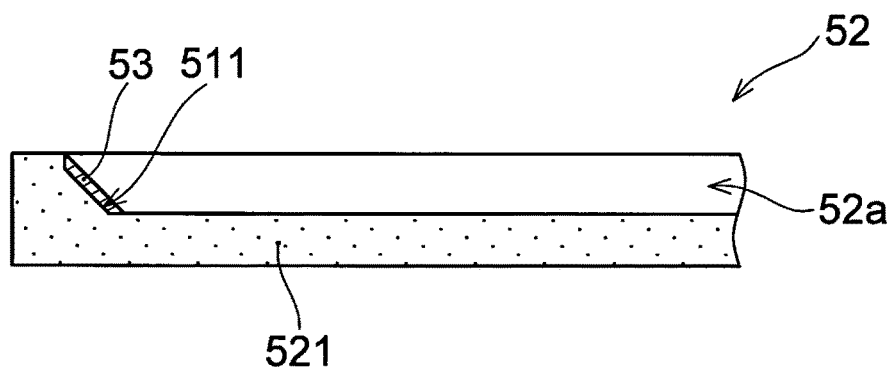
FIG. 9B is a cross-sectional view illustrating an example of a manufacturing process of the optical waveguide in the modified embodiment illustrated in FIG. 5B.
Figure 9C:
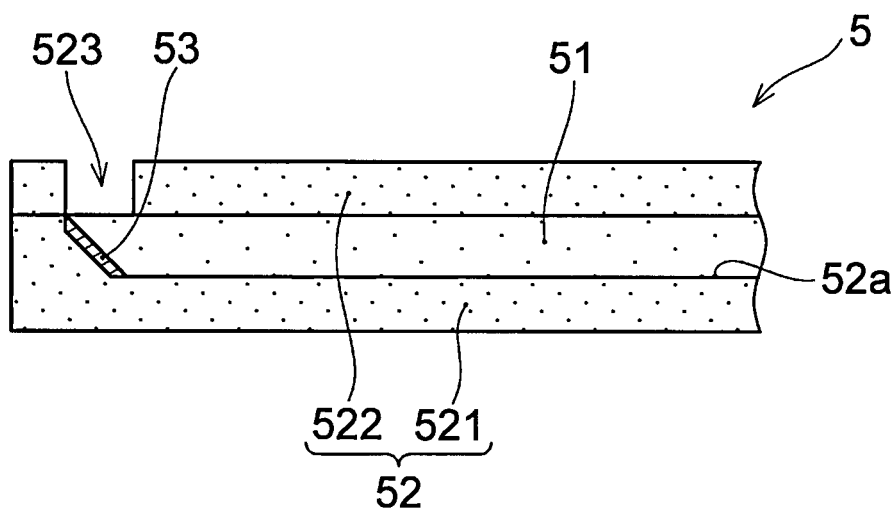
FIG. 9C is a cross-sectional view illustrating an example of a manufacturing process of the optical waveguide in the modified embodiment illustrated in FIG. 5B.

FIG. 9A illustrates a method for forming the optical waveguide 5 of the modified embodiment illustrated in FIG. 5A referenced above, and FIGS. 9B and 9C illustrate a method for forming the optical waveguide 5 of the modified embodiment illustrated in FIG. 5B.

As illustrated in FIG. 9A, in a case where the optical waveguide 5 in the example of FIG. 5A is formed, after the core part 51 and the clad part 52 are formed using a Mosquito method, an imprint method, or the like, the recess 54 is formed. The recess 54 is preferably formed before post-baking that completely cures the core part 51 and the clad part 52. For example, the recess 54 that reaches the bent part of the core part 51 is formed by excavation using a blade (S) such as a diamond saw having an inclined part at a front end. After that, a mask (not illustrated in the drawings) having an opening that exposes only the recess 54 is provided around the recess 54, and then, for example, by sputtering or the like, the reflector 53 (see FIG. 5A) formed of a metal film of aluminum, silver, gold or the like is formed.

In a case where the optical waveguide 5 in the example of FIG. 5B is formed, as illustrated in FIG. 9B, the reflector 53 is formed on a part of the clad part 52. For example, using an imprint method, a groove (52a) for forming the core part is formed in a base part 521 of the clad part 52 so as to have the inclined surface 511 at an end part thereof. After that, a mask (not illustrated in the drawings) that exposes only the inclined surface 511 of the groove (52a) is formed on the base part 521 and the groove (52a) of the clad part 52. Then, for example, by sputtering or the like, the reflector 53 formed of a metal film of aluminum, silver, gold or the like is formed on the inclined surface 511.

After that, as illustrated in FIG. 9B, the groove (52a) is filled with, for example, an acrylic-based resin or the like that forms the core part 51. After that, an acrylic resin or the like that forms a cover part 522 of the clad part 52 is supplied onto the core part 51 and the base part 521, and the core part 51 is covered by the clad part 52. After that, an opening 523 that exposes an end part of the core part 51 where the reflector 53 is formed is formed in the cover part 522 by exposure and development, or laser processing, or the like. Further, by filling the opening 523 with the resin that forms the core part 51, the optical waveguide 5 in the example of FIG. 5B is formed.

The wiring substrate of the embodiment is not limited to those having the structures illustrated in the drawings and those having the structures, shapes, and materials exemplified herein. As described above, the wiring substrate of the embodiment may have any laminated structure. For example, the wiring substrate of the embodiment may be a coreless substrate that does not include a core substrate. The wiring substrate of the embodiment may include any number of conductor layers and any number of insulating layers. It is also possible that the optical connector (C) is not provided, and it is also possible that the conductor pads (11b) and the conductor posts 62 for mounting the component (E2) are not formed, and therefore, it is also possible that the component region (A2) is not included.

Japanese Patent Application Laid-Open Publication No. 2008-129385 describes an optical component mounting substrate on a surface of which an optical waveguide and an optical semiconductor element are mounted. The optical waveguide having a light receiving and emitting part on one end side and a light emitting part (or light receiving part) of the optical semiconductor element connected to a wiring pattern via a bump are optically coupled on the other end side of the optical waveguide. Light emitted by the optical semiconductor element is incident on a core part of the optical waveguide and propagates to the light receiving and emitting part, and light incident on the light receiving and emitting part propagates through the core part and is incident on the optical semiconductor element from the other end side.

In the substrate described in Japanese Patent Application Laid-Open Publication No. 2008-129385, a clad layer of the optical waveguide is interposed between the core part on the other end side of the optical waveguide and the light emitting part (or the light receiving part) of the optical semiconductor element. That is, since a distance between the core part and the optical semiconductor element is large and, in addition, light propagates in any direction in the clad layer, it is thought that a high efficiency in optical coupling is unlikely to be obtained.

A wiring substrate according to an embodiment of the present invention includes: an insulating layer that has a surface having a first conductor pad; a covering layer that partially covers the insulating layer; an optical waveguide that is provided on the surface and includes a core part that transmits light; a conductor post that is formed of plating metal on the first conductor pad and penetrates the covering layer; and a first component region that is a region to be covered by a component connected to the conductor post. The core part has a first end surface that faces the opposite direction with respect to the insulating layer and is exposed from the optical waveguide in the first component region. A distance between the first end surface and the surface of the insulating layer is larger than a thickness of the covering layer.

According to an embodiment of the present invention, it may be possible that a coupling efficiency between the optical waveguide provided in the wiring substrate and a component optically coupled to the optical waveguide is improved and connection reliability between the component and the wiring substrate is improved.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
an insulating layer;
a conductor layer formed on a surface of the insulating layer and including a conductor pad;
a covering layer formed on the insulating layer such that the covering layer is covering a portion of the insulating layer;
an optical waveguide positioned on the surface of the insulating layer and comprising a core part configured to transmit light; and
a conductor post comprising plating metal and formed on the conductor pad of the conductor layer such that the conductor post is penetrating through the covering layer and configured to be connected to a component, wherein the insulating layer has a component region covered by the component when the component is connected to the conductor post, the optical waveguide is formed such that the core part has an end surface facing an opposite direction with respect to the insulating layer and exposed in the component region and that a distance between the end surface and the surface of the insulating layer is greater than a thickness of the covering layer.

2. The wiring substrate according to claim 1, wherein the optical waveguide includes a clad part sandwiching the core part such that the end surface of the core part is exposed on a surface of the clad part on an opposite side with respect to the insulating layer.

3. The wiring substrate according to claim 1, wherein the optical waveguide is formed such that the end surface of the core part is substantially parallel to the surface of the insulating layer.

4. The wiring substrate according to claim 1, wherein the optical waveguide is formed such that the core part includes a first portion extending along the surface of the insulating layer, a second portion connected to the first portion and bending toward an opposite direction with respect to the insulating layer, and a third portion connected to the second portion and having the end surface.

5. The wiring substrate according to claim 1, wherein the conductor post has an end surface facing substantially a same direction as the end surface of the core part in the optical waveguide.

6. The wiring substrate according to claim 1, wherein the conductor layer includes a wiring and a second conductor pad connected to the conductor pad by the wiring and configured to electrically connect a second component, and the insulating layer has a second component region covered by the second component when the second component is electrically connected to the second conductor pad of the conductor layer.

7. The wiring substrate according to claim 1, wherein the optical waveguide is formed such that the core part has a second end surface on an opposite side with respect to the end surface such that the second end surface is exposed and facing a same direction as the end surface.

8. The wiring substrate according to claim 7, wherein the optical waveguide is formed such that the core part includes a first portion extending along the surface of the insulating layer, two second portions connected to the first portion and bending toward an opposite direction with respect to the insulating layer, and two third portions connected to the two second portions respectively and having one of the end surface or the second end surface.

9. The wiring substrate according to claim 7, wherein the conductor layer includes a third conductor pad configured to electrically connect a third component, and the insulating layer has a third component region covered by the third component electrically connected to the third conductor pad when the third component is electrically connected to the third conductor pad of the conductor layer such that the second end surface of the core part is exposed in the third component region.

10. The wiring substrate according to claim 9, wherein the conductor layer includes a wiring and a second conductor pad connected to the conductor pad by the wiring and configured to electrically connect a second component, and the insulating layer has a second component region covered by the second component when the second component is electrically connected to the second conductor pad of the conductor layer.

11. The wiring substrate according to claim 1, wherein the conductor post is formed such that the conductor post has a substantially constant width from the conductor pad to an opposite side with respect to the conductor pad.

12. The wiring substrate according to claim 1, wherein the conductor post is formed such that the conductor post is protruding from a surface of the covering layer on an opposite side with respect to the insulating layer.

13. The wiring substrate according to claim 1, further comprising:
- a connection layer formed on an end surface of the conductor post on an opposite side with respect to the conductor pad and comprising a material having a melting point that is lower than a melting point of the conductor post.

14. The wiring substrate according to claim 13, wherein the conductor post is formed such that a distance between the end surface of the conductor post on an opposite side with respect to the conductor pad and the surface of the insulating layer is shorter than a distance between the end surface of the core part in the optical waveguide and the surface of the insulating layer, and the connection layer is formed such that a distance between a surface of the connection layer on an opposite side with respect to the conductor post and the surface of the insulating layer is longer than the distance between the end surface of the core part in the optical waveguide and the surface of the insulating layer.

15. The wiring substrate according to claim 1, wherein the optical waveguide is positioned in a region of the surface of the insulating layer that is not covered by the covering layer.

16. The wiring substrate according to claim 2, wherein the optical waveguide is formed such that the end surface of the core part is substantially parallel to the surface of the insulating layer.

17. The wiring substrate according to claim 2, wherein the optical waveguide is formed such that the core part includes a first portion extending along the surface of the insulating layer, a second portion connected to the first portion and bending toward an opposite direction with respect to the insulating layer, and a third portion connected to the second portion and having the end surface.

18. The wiring substrate according to claim 2, wherein the conductor post has an end surface facing substantially a same direction as the end surface of the core part in the optical waveguide.

19. The wiring substrate according to claim 2, wherein the conductor layer includes a wiring and a second conductor pad connected to the conductor pad by the wiring and configured to electrically connect a second component, and the insulating layer has a second component region covered by the second component when the second component is electrically connected to the second conductor pad of the conductor layer.

20. The wiring substrate according to claim 2, wherein the optical waveguide is formed such that the core part has a second end surface on an opposite side with respect to the end surface such that the second end surface is exposed and facing a same direction as the end surface.

* * * * *